US012672419B2

(12) United States Patent
Kim et al.

(10) Patent No.: US 12,672,419 B2
(45) Date of Patent: Jun. 30, 2026

(54) TANDEM SOLAR CELL AND MANUFACTURING METHOD THEREFOR

(71) Applicant: JUSUNG ENGINEERING CO., LTD., Gwangju-si (KR)

(72) Inventors: Jae Ho Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 120 days.

(21) Appl. No.: 18/273,964

(22) PCT Filed: Feb. 21, 2022

(86) PCT No.: PCT/KR2022/002482
§ 371 (c)(1),
(2) Date: Jul. 24, 2023

(87) PCT Pub. No.: WO2022/186529
PCT Pub. Date: Sep. 9, 2022

(65) Prior Publication Data
US 2024/0415000 A1      Dec. 12, 2024

(30) Foreign Application Priority Data

Mar. 5, 2021    (KR) ........................ 10-2021-0029647
Mar. 29, 2021   (KR) ........................ 10-2021-0040494

(51) Int. Cl.
H10K 30/57          (2023.01)
H10K 30/30          (2023.01)
(Continued)

(52) U.S. Cl.
CPC ............. H10K 30/57 (2023.02); H10K 30/30 (2023.02); H10K 30/40 (2023.02); H10K 39/10 (2023.02);
(Continued)

(58) Field of Classification Search
CPC ........ H10K 30/57; H10K 30/40; H10K 30/30; H10K 85/50; H10K 71/60; H10K 71/20;
(Continued)

(56) References Cited

U.S. PATENT DOCUMENTS 10,622,409  B2    4/2020   Kamino et al.
2005/0072461  A1    4/2005   Kuchinski et al.
(Continued)

FOREIGN PATENT DOCUMENTS

CN       108352415 A   *  7/2018   ....... H01L 31/02002
CN       112103271 A      12/2020
(Continued)

OTHER PUBLICATIONS

International Search Report for PCT/KR2022/002482, mailed May 26, 2022.

*Primary Examiner* — Uyen M Tran
(74) *Attorney, Agent, or Firm* — Renaissance IP Law Group LLP

(57)          ABSTRACT

The present inventive concept relates to a method of manufacturing a tandem solar cell, the method including: a step of preparing a perovskite solar cell, including a first conductive charge transporting layer, a light absorption layer, and a second conductive charge transporting layer, on a substrate; a step of forming a partition part in the perovskite solar cell to form a first perovskite unit solar cell and a second perovskite unit solar cell; a step of forming a contact part in the first perovskite unit solar cell to expose a certain region of the first perovskite unit solar cell; a step of forming a buffer layer in a top surface of each of the first perovskite unit solar cell and the second perovskite unit solar cell; a step of preparing a plurality of second solar cells; a step of bonding the plurality of second solar cells to the buffer layer to form a first unit tandem solar cell where the first perovskite unit solar cell, the buffer layer, and the second solar cell
(Continued)

are sequentially stacked and a second unit tandem solar cell where the second perovskite unit solar cell, the buffer layer, and the second solar cell are sequentially stacked; and a step of electrically connecting the first unit tandem solar cell to the second unit tandem solar cell.

10 Claims, 5 Drawing Sheets

(51) Int. Cl.

| | | |
|---|---|---|
| *H10K 30/40* | (2023.01) | |
| *H10K 39/10* | (2023.01) | |
| *H10K 39/12* | (2023.01) | |
| *H10K 39/15* | (2023.01) | |
| *H10K 39/18* | (2023.01) | |
| *H10K 71/20* | (2023.01) | |
| *H10K 71/60* | (2023.01) | |
| *H10K 85/50* | (2023.01) | |

(52) U.S. Cl.
CPC ............. *H10K 39/12* (2023.02); *H10K 39/15* (2023.02); *H10K 39/18* (2023.02); *H10K 71/20* (2023.02); *H10K 71/60* (2023.02); *H10K 85/50* (2023.02)

(58) Field of Classification Search
CPC ........ H10K 39/10; H10K 39/12; H10K 39/15; H10K 39/18
See application file for complete search history.

(56) References Cited

U.S. PATENT DOCUMENTS

| | | | | |
|---|---|---|---|---|
| 2011/0120553 A1* | 5/2011 | Watai | ...................... | H10F 10/17 |
| | | | | 257/E31.124 |
| 2012/0145231 A1 | 6/2012 | Woods et al. | | |
| 2013/0032277 A1* | 2/2013 | Hattori | .................. | B29C 66/944 |
| | | | | 156/231 |
| 2017/0170418 A1* | 6/2017 | Winkel | ................ | H10K 77/111 |
| 2020/0176196 A1* | 6/2020 | Lee | ........................ | H10K 85/50 |

FOREIGN PATENT DOCUMENTS

| | | | | | |
|---|---|---|---|---|---|
| JP | 2019021913 | A | 2/2019 | | |
| KR | 101070861 | B1 | 10/2011 | | |
| KR | 20180130397 | A | 12/2018 | | |
| KR | 20190016927 | A | 2/2019 | | |
| TW | 201603307 | A | 1/2016 | | |
| TW | 201614855 | A | 4/2016 | | |
| WO | 2011024534 | A1 | 3/2011 | | |
| WO | WO-2012035937 | A1 * | 3/2012 | ............. | B82Y 10/00 |
| WO | 2020252584 | A1 | 12/2020 | | |

* cited by examiner

TANDEM SOLAR CELL AND MANUFACTURING METHOD THEREFOR

TECHNICAL FIELD

The present inventive concept relates to a tandem solar cell, and more particularly, to a tandem solar cell including a perovskite solar cell.

BACKGROUND ART

Tandem solar cells are solar cells where cell efficiency increases by vertically stacking two solar cells.

In the related art, an attempt to apply a solar cell using a perovskite compound to a tandem solar cell has been performed. As an example of the attempt, a method has been proposed where a bulk-type solar cell is prepared and a tandem solar cell is manufactured by stacking a solar cell using a perovskite compound on the bulk-type solar cell through a deposition process or a coating process.

However, a method of manufacturing a tandem solar cell of the related art has a problem where a manufacturing process is complicated and current matching between a bulk-type solar cell and a solar cell using a perovskite compound is difficult.

DISCLOSURE

Technical Problem

The present inventive concept is devised to solve the above-described problem and is for providing a tandem solar cell, where a manufacturing process is simple and current matching between a bulk-type solar cell and a solar cell using a perovskite compound is easy, and a method of manufacturing the tandem solar cell.

Technical Solution

To accomplish the above-described objects, the present inventive concept may include a method of manufacturing a tandem solar cell, the method including: a step of preparing a perovskite solar cell, including a first conductive charge transporting layer, a light absorption layer, and a second conductive charge transporting layer, on a substrate; a step of forming a partition part in the perovskite solar cell to form a first perovskite unit solar cell and a second perovskite unit solar cell; a step of forming a contact part in the first perovskite unit solar cell to expose a certain region of the first perovskite unit solar cell; a step of forming a buffer layer in a top surface of each of the first perovskite unit solar cell and the second perovskite unit solar cell; a step of preparing a plurality of second solar cells; a step of bonding the plurality of second solar cells to the buffer layer to form a first unit tandem solar cell where the first perovskite unit solar cell, the buffer layer, and the second solar cell are sequentially stacked and a second unit tandem solar cell where the second perovskite unit solar cell, the buffer layer, and the second solar cell are sequentially stacked; and a step of electrically connecting the first unit tandem solar cell to the second unit tandem solar cell.

The step of preparing the perovskite solar cell may include a step of sequentially forming the first conductive charge transporting layer, the light absorption layer, and the second conductive charge transporting layer on the substrate.

The step of forming the partition part may include a process of removing a certain region of each of the first conductive charge transporting layer, the light absorption layer, and the second conductive charge transporting layer to expose a top surface of the substrate.

The step of forming the contact part may include a process of removing a certain region of each of the light absorption layer and the second conductive charge transporting layer to expose a top surface of the first conductive charge transporting layer.

The step of forming the buffer layer may include a process of forming a film, including a plurality of holes, in a top surface of each of the first perovskite unit solar cell and the second perovskite unit solar cell and a process of filling a conductive layer into the plurality of holes included in the film.

The process of forming the film including the plurality of holes may include a process of forming the film in a semi-dried state, and the step of forming the first unit tandem solar cell and the second unit tandem solar cell may include a process of placing the second solar cell on the buffer layer and then curing the film in the semi-dried state.

The plurality of holes included in the film may include a plurality of first holes passing through the film and extending in a first direction and a plurality of second holes passing through the film and extending in a second direction intersecting with the first direction, and the conductive layer may contact a top surface of each of the first and second perovskite unit solar cells and a bottom surface of the second solar cell.

The film may not overlap the contact part, and the contact part may not be covered by the film and is exposed.

The step of electrically connecting the first unit tandem solar cell to the second unit tandem solar cell may electrically connect an electrode pattern, included in a top surface of the second solar cell of the second unit tandem solar cell, to the first conductive charge transporting layer of the first perovskite unit solar cell exposed at a contact part of the first unit tandem solar cell by using a connection line.

The one connection line may extend along a side surface of the second solar cell of the second unit tandem solar cell and a side surface of the buffer layer thereunder, extend along a top surface and a side surface of the second conductive charge transporting layer and a side surface of a light absorption layer of the first perovskite unit solar cell provided at one side of the contact part across the partition part, and extend up to a top surface of the first conductive charge transporting layer of the first perovskite unit solar cell exposed at the contact part.

The step of preparing the plurality of second solar cells may include a process of forming an electrode pattern having a same pattern as a pattern of the conductive layer, and the step of bonding the plurality of second solar cells may include a process of allowing the conductive layer to overlap the electrode pattern.

The present inventive concept provides a tandem solar cell including: a first unit tandem solar cell where a first perovskite unit solar cell, a buffer layer, and a second solar cell provided on a substrate are sequentially stacked; a second unit tandem solar cell where a second perovskite unit solar cell, a buffer layer, and a second solar cell are sequentially stacked, the second unit tandem solar cell being provided on the substrate and being apart from the first unit tandem solar cell by a partition part; and a connection line connecting the first unit tandem solar cell to the second unit tandem solar cell.

The first perovskite unit solar cell may include a first conductive charge transporting layer provided on the substrate, a light absorption layer formed on the first conductive charge transporting layer, and a second conductive charge transporting layer formed on the light absorption layer, and a contact part exposing a top surface of the first conductive charge transporting layer by removing a certain region of each of the light absorption layer and the second conductive charge transporting layer, an electrode pattern may be provided in a top surface of the second solar cell, and the connection line may connect the electrode pattern, provided in the top surface of the second solar cell of the second unit tandem solar cell, to the first conductive charge transporting layer exposed at the contact part of the first perovskite unit solar cell.

The contact part may not overlap the buffer layer.

The connection line may extend along a side surface of the second solar cell of the second unit tandem solar cell and a side surface of the buffer layer thereunder, extend along a top surface and a side surface of the second conductive charge transporting layer and a side surface of a light absorption layer of the first perovskite unit solar cell provided at one side of the contact part across the partition part, and extend up to a top surface of the first conductive charge transporting layer of the first perovskite unit solar cell exposed at the contact part.

The buffer layer may include a film, including a plurality of first holes extending in a first direction and a plurality of second holes extending in a second direction intersecting with the first direction, and a conductive layer filled into the plurality of first and second holes, and the conductive layer may contact a top surface of each of the first and second perovskite unit solar cells and a bottom surface of the second solar cell.

An electrode pattern having the same pattern as a pattern of the conductive layer may be provided in a top surface of the second solar cell, and the electrode pattern may overlap the conductive layer.

Advantageous Effect

According to the present inventive concept, the following effects may be realized.

According to an embodiment of the present inventive concept, because a tandem solar cell is manufactured through a process of forming a buffer layer on a plurality of perovskite unit solar cells and stacking a separately manufactured second solar cell on the buffer layer, a manufacturing process is simple, and current matching between the perovskite unit solar cell and the second solar cell is easy.

MODE FOR INVENTION

Figure 1A:
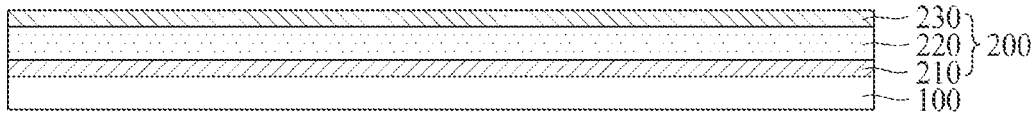
FIGS. 1A to 1G are process cross-sectional views illustrating a method of manufacturing a tandem solar cell according to an embodiment of the present inventive concept.

Advantages and features of the present inventive concept, and implementation methods thereof will be clarified through following embodiments described with reference to the accompanying drawings. The present inventive concept may, however, be embodied in different forms and should not be construed as limited to the embodiments set forth herein. Rather, these embodiments are provided so that this invention will be thorough and complete, and will fully convey the scope of the present inventive concept to those skilled in the art. Furthermore, the present inventive concept is only defined by scopes of claims.

A shape, a size, a ratio, an angle, and a number disclosed in the drawings for describing embodiments of the present inventive concept are merely an example, and thus, the present inventive concept is not limited to the illustrated details. Like reference numerals refer to like elements throughout. In the following description, when the detailed description of the relevant known technology is determined to unnecessarily obscure the important point of the present inventive concept, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present inventive concept.

Features of various embodiments of the present inventive concept may be partially or overall coupled to or combined with each other, and may be variously inter-operated with each other and driven technically as those skilled in the art can sufficiently understand. The embodiments of the present inventive concept may be carried out independently from each other, or may be carried out together in co-dependent relationship.

Hereinafter, preferable embodiments of the present inventive concept will be described in detail with reference to the accompanying drawings.

FIGS. 1A to 1G are process cross-sectional views illustrating a method of manufacturing a tandem solar cell according to an embodiment of the present inventive concept.

First, as seen in FIG. 1A, a perovskite solar cell layer 200 is formed on a substrate 100.

The substrate 100 may include a semiconductor material such as a silicon wafer, or may include glass or plastic.

The perovskite solar cell layer 200 may be formed through a process of forming a first conductive charge transporting layer 210 on the substrate 100, forming a light absorption layer 220 on the first conductive charge transporting layer 210, and a second conductive charge transporting layer 230 on the light absorption layer 220.

In a case where the first conductive charge transporting layer 210 is formed of an electron transporting layer, the second conductive charge transporting layer 230 is formed of a hole transporting layer, and in a case where the first conductive charge transporting layer 210 is formed of a hole transporting layer, the second conductive charge transporting layer 230 is formed of an electron transporting layer.

The electron transporting layer may include a compound including various N-type organic or inorganic materials and an N-type organic material, such as bathocuproine (BCP), C60, or phenyl-C61-butyric acid methyl ester (PCBM), or various N-type metal oxides such as ZnO, c-TiO$_2$/mp-TiO$_2$, SnO$_2$, or indium zinc oxide (IZO) known to those skilled in the art.

The hole transporting layer may include various p-type organic materials such as Spiro-MeO-TAD, Spiro-TTB, polyaniline, polyphenol, poly(3,4-ethylenedioxythiophene)-poly(styrenesulfonate) (PEDOT-PSS), poly[bis(4-phenyl) (2,4,6-trimethylphenyl)amine] (PTAA), and poly(3-hexyl-thiophene-2,5-diyl) (P3HT) known to those skilled in the art, or may include a compound including various P-type organic or inorganic materials and various P-type metal oxides such as Ni oxide, Mo oxide, V oxide, W oxide, or Cu oxide known to those skilled in the art.

The light absorption layer 220 includes a perovskite compound.

Figure 1B:
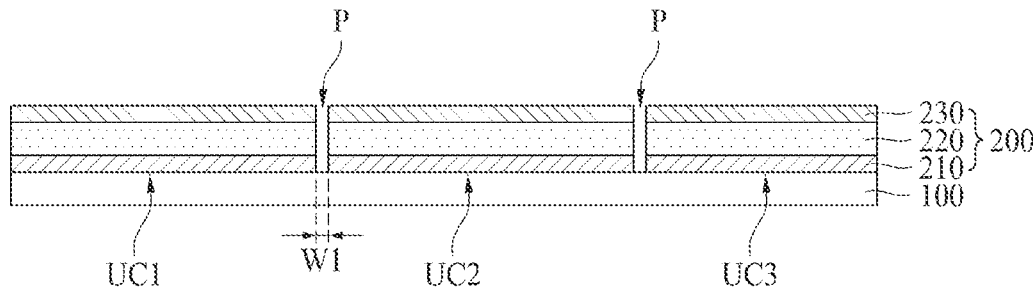

Subsequently, as seen in FIG. 1B, a plurality of perovskite unit solar cells UC1, UC2, and UC3 are formed by forming a partition part P in the perovskite solar cell layer 200.

The partition part P is formed by removing a certain region of each of the first conductive charge transporting layer 210, the light absorption layer 220, and the second conductive charge transporting layer 230 which configure the perovskite solar cell layer 200. The partition part P may be formed through a primary scribing process (particularly, a laser scribing process). A top surface of the substrate 100 is exposed in a region where the partition part P is formed.

First to third perovskite unit solar cells UC1, UC2, and UC3 are prepared with being apart from one another by the partition part P. In this case, each of the first to third perovskite unit solar cells UC1, UC2, and UC3 includes the first conductive charge transporting layer 210, the light absorption layer 220, and the second conductive charge transporting layer 230.

The partition part P may be formed to have a first width W1.

Figure 1C:
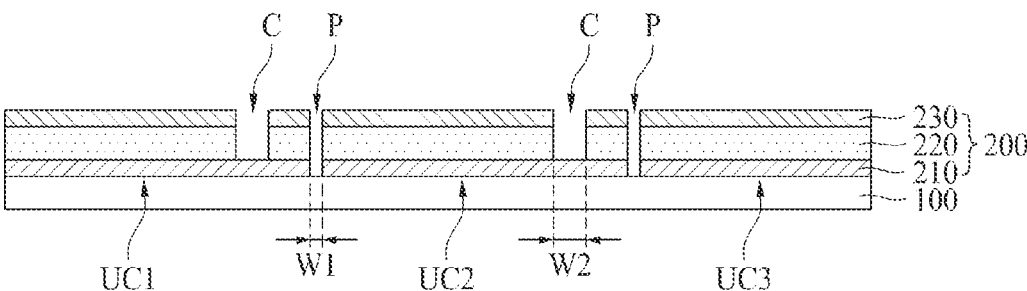

Subsequently, as seen in FIG. 1C, a contact part C is formed in each of the first and second perovskite unit solar cells UC1 and UC2. The contact part C is apart from the partition part P. The contact part C is formed by removing a certain region of each of the light absorption layer 220 and the second conductive charge transporting layer 230.

The contact part C is for serially connecting the first to third perovskite unit solar cells UC1, UC2, and UC3. The contact part C may be formed through a secondary scribing process (particularly, a laser scribing process). A top surface of the first conductive charge transporting layer 210 is exposed in a region where the contact part C is formed. The formation of the contact part C may be omitted in the unit solar cell UC3 disposed at one end (for example, a right end) among the plurality of perovskite unit solar cells UC1, UC2, and UC3.

The contact part C may be formed to have a second width W2. In this case, the second width W2 of the contact part C may be formed to be greater than a first width W1 of the partition part P, and thus, a process of FIG. 1G described below may be easily performed.

Figure 1D:
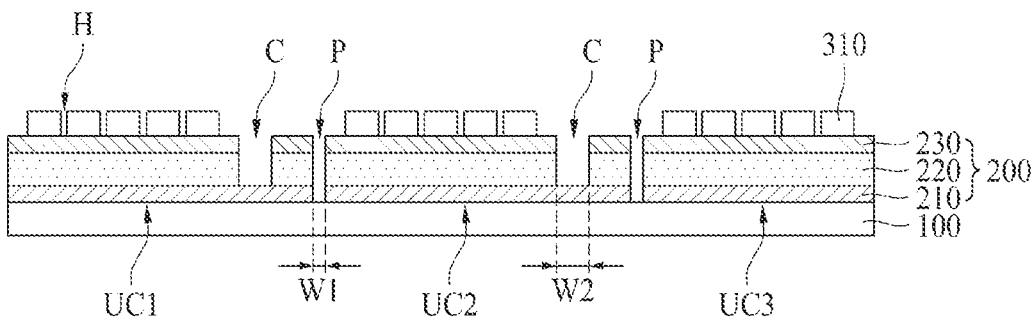

Subsequently, as seen in FIG. 1D, a film 310 including a plurality of holes H is formed in a top surface of each of the first to third perovskite unit solar cells UC1, UC2, and UC3.

That is, one film 310 including a plurality of holes H is formed in the top surface of the first perovskite unit solar cell UC1, another film 310 including a plurality of holes H is formed in the top surface of the second perovskite unit solar cell UC2, and the other film 310 including a plurality of holes H is formed in the top surface of the third perovskite unit solar cell UC3. In this case, the one film 310 formed in the top surface of the first perovskite unit solar cell UC1, the another film 310 formed in the top surface of the second perovskite unit solar cell UC2, and the the other film 310 formed in the top surface of the third perovskite unit solar cell UC3 are apart from one another without contacting therebetween.

The film 310 may be formed of an organic polymer compound, but is not limited thereto. In this case, the film 310 including the organic polymer compound may be formed in a semi-dried state. The semi-dried state denotes a state before complete curing and denotes a state where the film 310 is capable of being attached on the other element through a curing process without a separate adhesive layer.

The plurality of holes H are formed to pass through the film 310, and thus, a top surface of the second conductive charge transporting layer 230 of each of the first to third perovskite unit solar cells UC1, UC2, and UC3 is exposed through the plurality of holes H.

The film 310 may be formed not to overlap the contact part C, and thus the contact part C is exposed without being covered by the film 310, whereby a process of FIG. 1G described below may be smoothly performed.

Furthermore, the film 310 may be formed not to overlap the partition part P. But it is not limited thereto and the film 310 may be formed to overlap the partition part P. In this case, a connection line 500 may be shortened in the process of FIG. 1G described below.

Figure 1E:
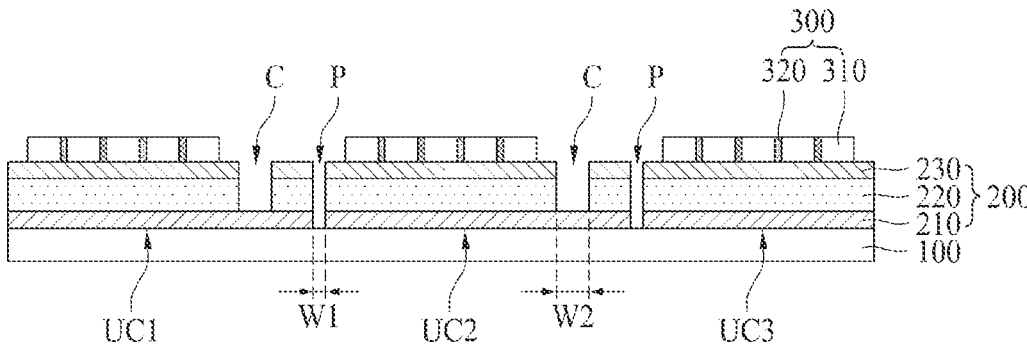

Subsequently, as seen in FIG. 1E, a conductive layer 320 is filled into the plurality of holes H of the film 310 provided on the top surface of each of the first to third perovskite unit solar cells UC1, UC2, and UC3. Accordingly, a buffer layer 300 including the film 310 and the conductive layer 320 is formed in the top surface of each of the first to third perovskite unit solar cells UC1, UC2, and UC3.

The conductive layer 320 may be formed of a metal material, but is not limited thereto. The conductive layer 320 may be filled into the plurality of holes H of the film 310 through a printing process, but is not limited thereto.

The conductive layer 320 contacts a top surface of the second conductive charge transporting layer 230, under the plurality of holes H.

Despite a state where the conductive layer 320 is formed, the film 310 may maintain a semi-dried state.

The buffer layer 300 will be described below with reference to FIG. 2.

Figure 2:
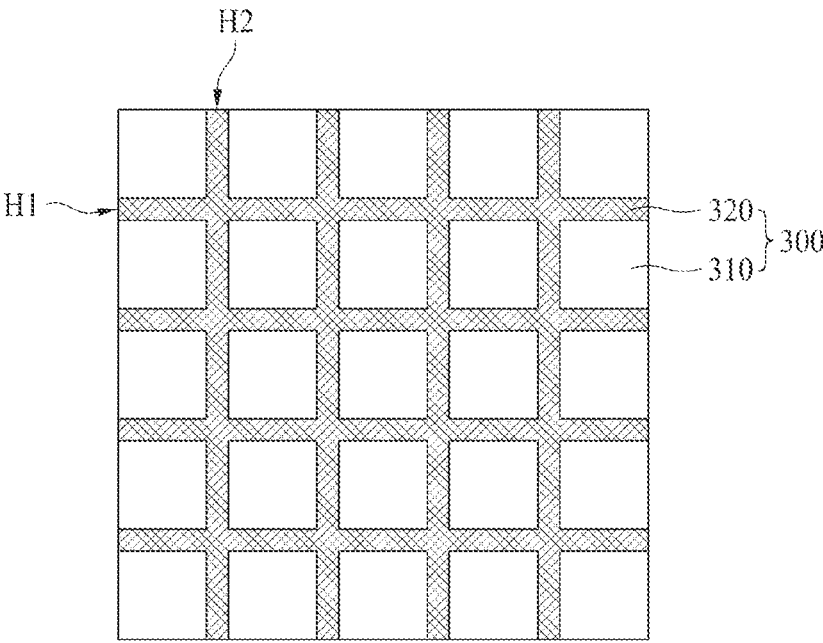
FIG. 2 is a schematic plan view of a buffer layer according to an embodiment of the present inventive concept.

FIG. 2 is a schematic plan view of a buffer layer 300 according to an embodiment of the present inventive concept. As seen in FIG. 2, the buffer layer 300 according to an embodiment of the present inventive concept may include a film 310 including a plurality of holes H1 and H2 and a conductive layer 320 filled into the plurality of holes H1 and H2.

The plurality of holes H1 and H2 include a plurality of first holes H1 arranged in a first direction (for example, a widthwise direction) and a plurality of second holes H2 arranged in a second direction (for example, a lengthwise direction). The plurality of first holes H1 and the plurality of second holes H2 may be formed to intersect with one another, and thus, a hole H1 and H2 pattern wholly having a lattice structure may be formed.

The conductive layer 320 may be provided to fill inner portions of all of the plurality of holes H1 and H2, and thus, the conductive layer 320 may be formed to wholly have a pattern having a lattice structure.

Figure 1F:
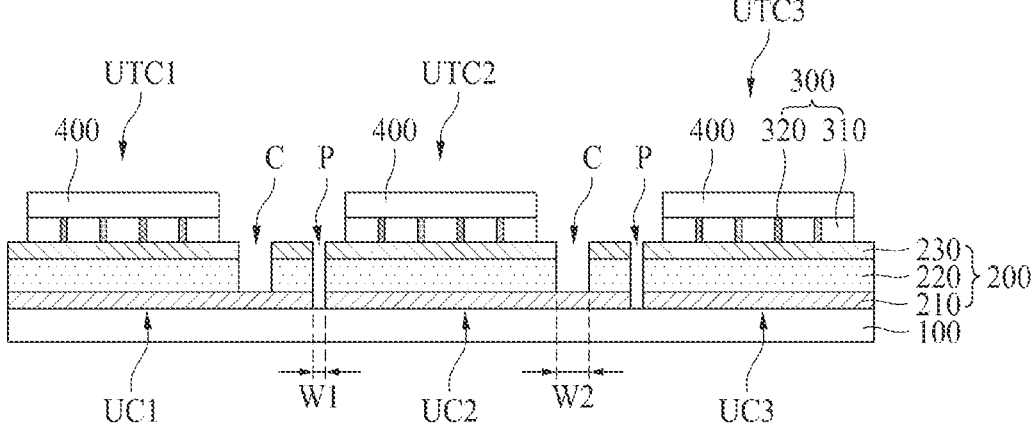

Subsequently, as seen in FIG. 1F, a second solar cell 400 is placed on the buffer layer 300, and then, by curing the film 310 configuring the buffer layer 300 through a curing process, the second solar cell 400 is attached on the film 310. Accordingly, a plurality of unit tandem solar cells UTC1, UTC2, and UTC3 are formed.

That is, a first unit tandem solar cell UTC1 where a first perovskite unit solar cell UC1, a buffer layer 300, and a second solar cell 400 are sequentially stacked, a second unit tandem solar cell UTC2 where a second perovskite unit solar cell UC2, a buffer layer 300, and a second solar cell 400 are sequentially stacked, and a third unit tandem solar cell UTC3 where a third perovskite unit solar cell UC3, a buffer layer 300, and a second solar cell 400 are sequentially stacked are formed with being apart from one another.

In this case, the second solar cell 400 is placed and attached on the buffer layer 300 in a state where the second solar cell 400 is manufactured as an individual solar cell.

The second solar cells 400 are individually formed on a top surface of each of the first to third perovskite unit solar cells UC1, UC2, and UC3, and the individually formed second solar cells 400 are apart from one another.

Therefore, the first to third perovskite unit solar cells UC1, UC2, and UC3 are formed under the buffer layer 300 with the buffer layer 300 therebetween, and the second solar cell 400 is formed over the buffer layer 300.

In this case, the first to third perovskite unit solar cells UC1, UC2, and UC3 may be electrically connected to the second solar cell 400 by the conductive layer 320 of the buffer layer 300. The conductive layer 320 contacts each of a top surface of a second conductive charge transporting layer 230 of each of the first to third perovskite unit solar cells UC1, UC2, and UC3 and a bottom surface of the second solar cell 400.

The second solar cell 400 may be formed of a bulk-type solar cell, and this will be described below with reference to FIGS. 3 and 4.

Figure 3:
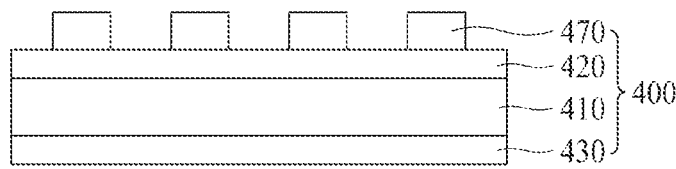
FIG. 3 is a schematic cross-sectional view of a second solar cell according to an embodiment of the present inventive concept.

FIG. 3 is a schematic cross-sectional view of a second solar cell 400 according to an embodiment of the present inventive concept.

As seen in FIG. 3, the second solar cell 400 according to an embodiment of the present inventive concept comprises a semiconductor substrate 410, a first semiconductor layer 420, a second semiconductor layer 430, and an electrode pattern 470.

The semiconductor substrate 410 may include an N-type or P-type semiconductor wafer. Although not shown in detail, a concave-convex structure may be formed in at least one surface of a top surface and a bottom surface of the semiconductor substrate 410, and in this case, at least one of the first semiconductor layer 420 and the second semiconductor layer 430 may also be formed in a concave-convex structure corresponding to the concave-convex structure of the semiconductor substrate 410.

The first semiconductor layer 420 is formed in a top surface of the semiconductor substrate 410 and is formed to have a certain polarity, and the second semiconductor layer 430 is formed in a bottom surface of the semiconductor substrate 410 and is formed to have a polarity which differs from that of the first semiconductor layer 420.

Particularly, the second semiconductor layer 430 configuring a bottom surface of the second solar cell 400 contacts the conductive layer 320 of the buffer layer 300 described above and is formed to have a polarity which differs from that of the second conductive charge transporting layer 230. For example, when the second conductive charge transporting layer 230 is formed of an electron transporting layer, the second semiconductor layer 430 may be formed to have a P-type polarity and the first semiconductor layer 420 may be formed to have an N-type polarity. Also, when the second conductive charge transporting layer 230 is formed of a hole transporting layer, the second semiconductor layer 430 may be formed to have an N-type polarity and the first semiconductor layer 420 may be formed to have a P-type polarity.

Each of the first semiconductor layer 420 and the second semiconductor layer 430 may be formed by doping a certain dopant on the top surface and the bottom surface of the semiconductor substrate 410, and in this case, the first semiconductor layer 420 and the second semiconductor layer 430 may be formed of a semiconductor wafer like the semiconductor substrate 410.

The electrode pattern 470 is patterned on the top surface of the first semiconductor layer 420. The electrode pattern 470 may be formed through a process such as a screen printing process known to those skilled in the art.

Figure 4:
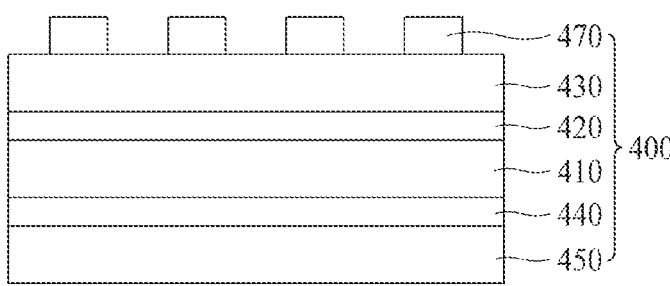
FIG. 4 is a schematic cross-sectional view of a second solar cell according to another embodiment of the present inventive concept.

FIG. 4 is a schematic cross-sectional view of a second solar cell 400 according to another embodiment of the present inventive concept.

As seen in FIG. 4, the second solar cell 400 according to another embodiment of the present inventive concept comprises a semiconductor substrate 410, a first semiconductor layer 420, a second semiconductor layer 430, a third semiconductor layer 440, a fourth semiconductor layer 450, and an electrode pattern 470.

The semiconductor substrate 410 may include an N-type or P-type semiconductor wafer. Although not shown in detail, a concave-convex structure may be formed in at least one surface of a top surface and a bottom surface of the semiconductor substrate 410, and in this case, at least one of the first to fourth semiconductor layers 420, 430, 440, and 450 may also be formed in a concave-convex structure corresponding to the concave-convex structure of the semiconductor substrate 410.

The first semiconductor layer 420 may be formed on the top surface of the semiconductor substrate 410 through a thin film deposition process such as a chemical vapor deposition (CVD) process or an atomic layer deposition (ALD) process and may be formed of an intrinsic semiconductor layer. However, depending on the case, the first semiconductor layer 420 may be formed of a semiconductor layer doped with a small amount of dopant.

The second semiconductor layer 430 is formed on a top surface of the first semiconductor layer 420. The second semiconductor layer 430 may be formed through a thin film deposition process and may be formed of a semiconductor layer doped with a large amount of dopant. The first semiconductor layer 420 may be formed by doping a small amount of dopant having the same polarity as that of the semiconductor substrate 410, and then, the second semiconductor layer 430 may be formed by doping a large amount of the dopant.

The third semiconductor layer 440 may be formed on the bottom surface of the semiconductor substrate 410. The third semiconductor layer 440 may be formed through a thin film deposition process and may be formed of an intrinsic semiconductor layer. However, depending on the case, the third semiconductor layer 440 may be formed of a semiconductor layer doped with a small amount of dopant. In this case, a polarity of a dopant doped on the third semiconductor layer 440 is opposite to that of a dopant doped on the first semiconductor layer 420.

The fourth semiconductor layer 450 may be formed on a bottom surface of the third semiconductor layer 440. The fourth semiconductor layer 450 may be formed through a thin film deposition process and may be formed of a semiconductor layer doped with a large amount of dopant. In this case, a polarity of a dopant doped on the fourth semiconductor layer 450 is opposite to that of a dopant doped on the second semiconductor layer 430. The third semiconductor layer 440 may be formed by doping a small amount of dopant having different polarity as that of the semiconductor substrate 410, and then, the fourth semiconductor layer 450 may be formed by doping a large amount of the dopant.

The fourth semiconductor layer 450 configuring the bottom surface of the second solar cell 400 contacts the conductive layer 320 of the buffer layer 300 described above and is formed to have a polarity which differs from that of the second conductive charge transporting layer 230. For example, when the second conductive charge transporting layer 230 is formed of an electron transporting layer, the fourth semiconductor layer 450 may be formed to have a P-type polarity, and when the second conductive charge transporting layer 230 is formed of a hole transporting layer, the fourth semiconductor layer 450 may be formed to have an N-type polarity.

The electrode pattern 470 is patterned on the top surface of the second semiconductor layer 430. The electrode pattern 470 may be formed through a process such as a screen printing process known to those skilled in the art.

Figure 1G:
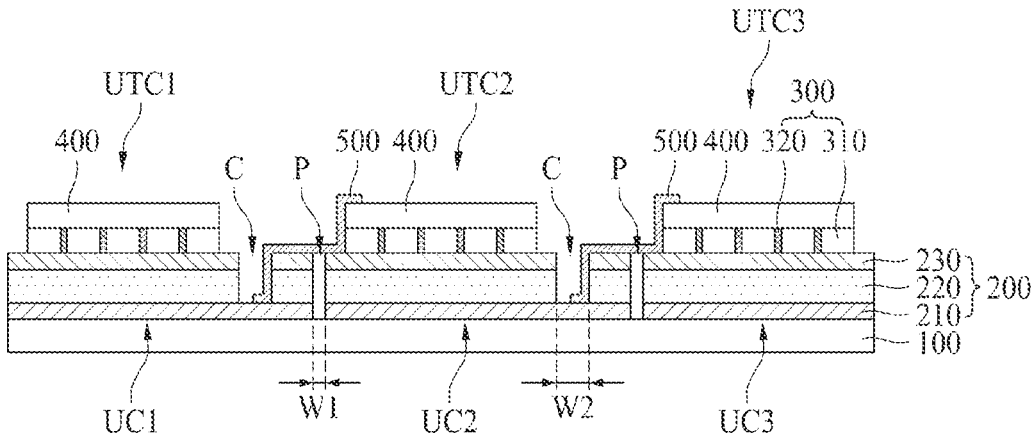

Subsequently, as seen in FIG. 1G, a plurality of unit tandem solar cells UTC1, UTC2, and UTC3 may be electrically connected to one another through a connection line 500.

In detail, a first unit tandem solar cell UTC1 may be serially connected to a second unit tandem solar cell UTC2 through one connection line 500, and the second unit tandem solar cell UTC2 may be serially connected to a third unit tandem solar cell UTC3 through one other connection line 500.

The one connection line 500 electrically connects the first conductive charge transporting layer 210 exposed at a contact part C of the first unit tandem solar cell UTC1 with a top surface of the second solar cell 400 of the second unit tandem solar cell UTC2. In this case, the top surface of the second solar cell 400 of the second unit tandem solar cell UTC2 connected to the one connection line 500 may be formed to have the electrode pattern 470 of FIGS. 3 and 4 described above. In this case, a polarity of the first semiconductor layer 420 of FIG. 3 or a polarity of the second semiconductor layer 430 of FIG. 4 provided under the electrode pattern 470 is opposite to that of the first conductive charge transporting layer 210, and thus, the first unit tandem solar cell UTC1 may be serially connected to the second unit tandem solar cell UTC2.

The one connection line 500 extends along a top surface and a side surface of the second solar cell 400 of the second unit tandem solar cell UTC2 and a side surface of the buffer layer 300 under the second solar cell 400, extends along a top surface and a side surface of the second conductive charge transporting layer 230 and a side surface of the light absorption layer 220 which are provided at one side (in detail, a right side) of the contact part C across a partition part P between the first unit tandem solar cell UTC1 and the second unit tandem solar cell UTC2, and extends up to a top surface of a first conductive charge transporting layer 210 of the first unit tandem solar cell UTC1 exposed at the contact part C. In this case, an end of the one connection line 500 does not contact a light absorption layer 220 of the first unit tandem solar cell UTC1 provided at the other side (in detail, a left side) of the contact part C.

Figure 5:
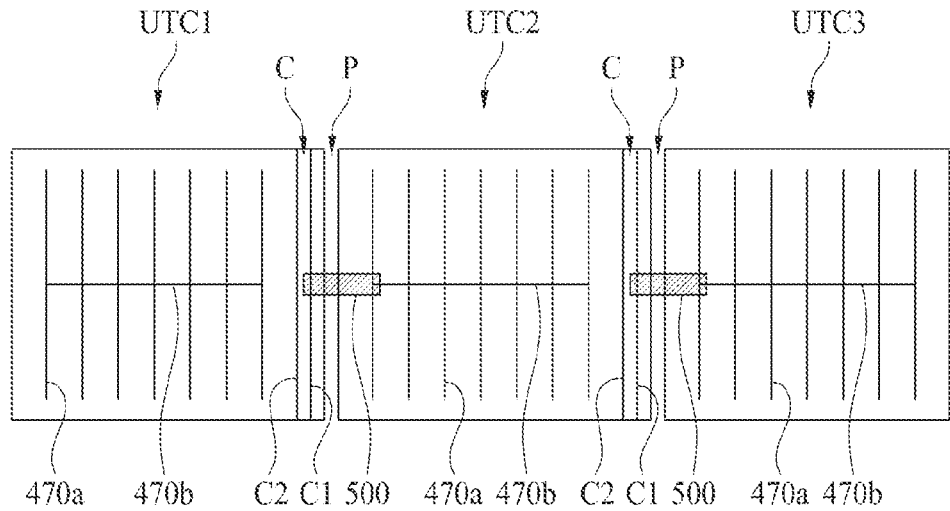
FIG. 5 is a plan view of a tandem solar cell according to an embodiment of the present inventive concept.

FIG. 5 is a plan view of a tandem solar cell according to an embodiment of the present inventive concept and relates to a tandem solar cell manufactured by a manufacturing method according to FIGS. 1A to 1G described above. Therefore, like reference numerals refer to like elements.

As seen in FIG. 5, the tandem solar cell according to an embodiment of the present inventive concept includes a first unit tandem solar cell UTC1, a second unit tandem solar cell UTC2, and a third unit tandem solar cell UTC3. The number and arrangement of unit tandem solar cells UTC1, UTC2, and UTC3 may be variously changed.

A partition part P is formed between the first unit tandem solar cell UTC1 and the second unit tandem solar cell UTC2 and between the second unit tandem solar cell UTC2 and the third unit tandem solar cell UTC3. Accordingly, a plurality of unit tandem solar cells UTC1, UTC2, and UTC3 are apart from one another by the partition part P. The partition part P may be formed in a first direction (for example, a vertical direction).

Moreover, each of the first unit tandem solar cell UTC1 and the second unit tandem solar cell UTC2 includes a contact part C. The contact part C included in the first unit tandem solar cell UTC1 is formed in the first direction, which is the same as the partition part P, near the partition part P between the first unit tandem solar cell UTC1 and the second unit tandem solar cell UTC2. Similarly, the contact part C included in the second unit tandem solar cell UTC2 is formed in the first direction, which is the same as the partition part P, near the partition part P between the second unit tandem solar cell UTC2 and the third unit tandem solar cell UTC3.

Electrode patterns 470a and 470b are formed in a top surface of each of the first to third unit tandem solar cells UTC1, UTC2, and UTC3. The electrode patterns 470a and 470b may include a plurality of first electrode patterns 470a extending in the first direction and a second electrode pattern 470b extending in a second direction (for example, a horizontal direction) which differs from the first direction. The second electrode pattern 470b intersects with the plurality of first electrode patterns 470a and electrically connects the plurality of first electrode patterns 470a.

The first unit tandem solar cell UTC1 and the second unit tandem solar cell UTC2 are electrically connected to each other through one connection line 500, and the second unit tandem solar cell UTC2 and the third unit tandem solar cell UTC3 are electrically connected to each other through one other connection line 500. Particularly, the first unit tandem solar cell UTC1 and the second unit tandem solar cell UTC2 are serially connected to each other through one connection line 500, and the second unit tandem solar cell UTC2 and the third unit tandem solar cell UTC3 are serially connected to each other through one other connection line 500.

The one connection line 500 extend up to a contact part C of the first unit tandem solar cell UTC1 from the electrode patterns 470*a* and 470*b* of the second unit tandem solar cell UTC2, and the one other connection line 500 extend up to a contact part C of the second unit tandem solar cell UTC2 from the electrode patterns 470*a* and 470*b* of the third unit tandem solar cell UTC3.

In this case, the one connection line 500 may overlap the second electrode pattern 470*b* and at least one of the plurality of first electrode patterns 470*a* of the second unit tandem solar cell UTC2, may be directly connected to the overlapping the second electrode pattern 470*b* and the at least one first electrode pattern 470*a*, and may extend in the second direction which is the same as an extension direction of the second electrode pattern 470*b*. And, the one other connection line 500 may overlap the second electrode pattern 470*b* and at least one of the plurality of first electrode patterns 470*a* of the third unit tandem solar cell UTC3, may be directly connected to the overlapping the second electrode pattern 470*b* and the at least one first electrode pattern 470*a*, and may extend in the second direction which is the same as an extension direction of the second electrode pattern 470*b*.

Moreover, the one connection line 500 passes through one end C1 (for example, a right end) of a contact part C of the first unit tandem solar cell UTC1, but does not extend up to the other end C2 (for example, a left end) of the contact part C and does not contact the other end C2 of the contact part C. Similarly, the one other connection line 500 passes through one end C1 (for example, a right end) of a contact part C of the second unit tandem solar cell UTC2, but does not extend up to the other end C2 (for example, a left end) of the contact part C and does not contact the other end C2 of the contact part C.

Figure 6:
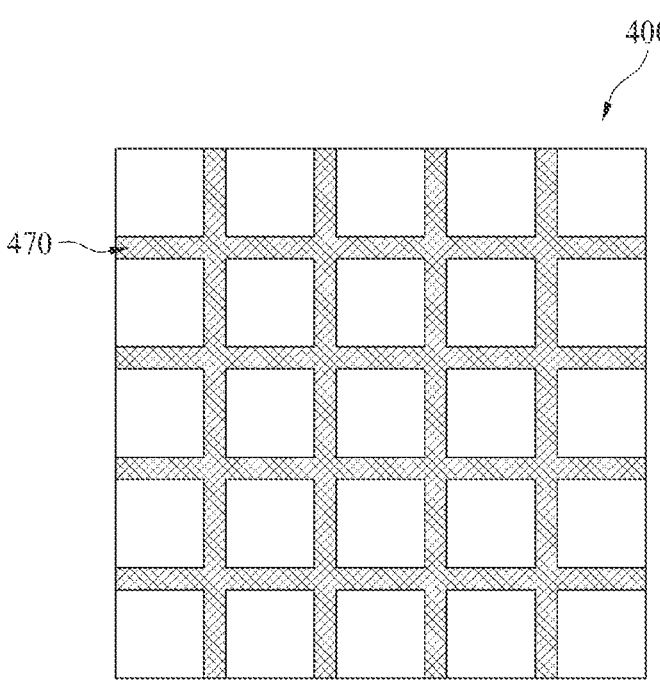
FIG. 6 is a schematic plan view of a second solar cell according to an embodiment of the present inventive concept.

FIG. 6 is a schematic plan view of a second solar cell 400 according to an embodiment of the present inventive concept and shows an electrode pattern 470 structure according to an embodiment of the second solar cell 400.

As seen in FIG. 6, the electrode pattern 470 may be provided at an uppermost portion of the second solar cell 400 and a plurality of electrode patterns 470 may be arranged in a first direction (for example, a widthwise direction) and arranged in a second direction (for example, a lengthwise direction), and thus, the electrode pattern 470 may be formed to have a pattern wholly having a lattice structure.

The electrode pattern 470 may be formed to have the same pattern as that of the conductive layer 320 of FIG. 2 described above. That is, the lattice structure of the electrode pattern 470 may be formed of the same structure as the lattice structure of the conductive layer 320 of FIG. 2 described above, and thus, in performing a bonding process of the second solar cell 400, the electrode pattern 470 and the conductive layer 320 may be formed to overlap each other. This will be described below with reference to FIG. 7.

Figure 7:
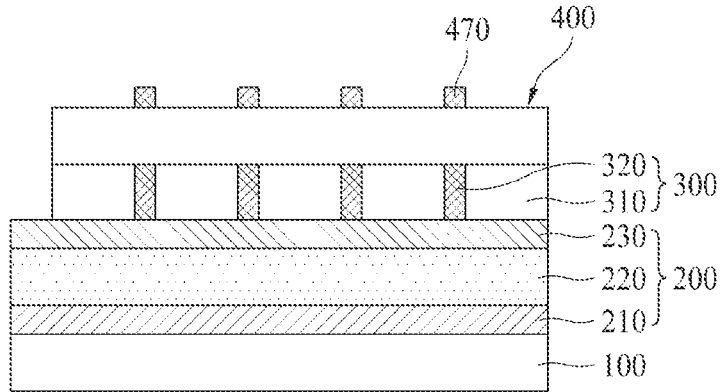
FIG. 7 is a schematic cross-sectional view of a tandem solar cell according to another embodiment of the present inventive concept.

FIG. 7 is a schematic cross-sectional view of a tandem solar cell according to another embodiment of the present inventive concept.

As seen in FIG. 7, a perovskite solar cell layer 200 is formed on a substrate 100, a buffer layer 300 is formed on the perovskite solar cell layer 200, and a second solar cell 400 is formed on the buffer layer 300.

The perovskite solar cell layer 200 includes a first conductive charge transporting layer 210, a light absorption layer 220, and a second conductive charge transporting layer 230. A configuration thereof is as described above, and thus, a repeated description is omitted.

The buffer layer 300 includes a film 310 and a conductive layer 320. A configuration thereof is as described above, and thus, a repeated description is omitted.

An electrode pattern 470 is formed at an upper portion of the second solar cell 400, and although not shown in detail under the electrode pattern 470, a semiconductor substrate 410, a first semiconductor layer 420, and a second semiconductor layer 430 may be provided as in FIG. 3 described above, or a semiconductor substrate 410, a first semiconductor layer 420, a second semiconductor layer 430, a third semiconductor layer 440, and a fourth semiconductor layer 450 may be provided as in FIG. 4 described above.

In this case, the electrode pattern 470 of the second solar cell 400 is formed to overlap a conductive layer 320 of the buffer layer 300. As described above, because the electrode pattern 470 and the conductive layer 320 are formed to overlap each other, the loss of sunlight incident on an inner portion of a solar cell may be minimized.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A method of manufacturing a tandem solar cell, the method comprising:

a step of preparing a perovskite solar cell, including a first conductive charge transporting layer, a light absorption layer, and a second conductive charge transporting layer, on a substrate;

a step of forming a partition part in the perovskite solar cell to form a first perovskite unit solar cell and a second perovskite unit solar cell;

a step of forming a contact part in the first perovskite unit solar cell to expose a top surface of the first conductive charge transporting layer of the first perovskite unit solar cell by removing a certain region of each of the light absorption layer and the second conductive charge transporting layer of the first perovskite unit solar cell;

a step of forming a buffer layer in a first portion of a top surface of each of the first perovskite unit solar cell and the second perovskite unit solar cell to expose a second portion of the top surface of each of the first perovskite unit solar cell and the second perovskite unit solar cell;

a step of preparing a plurality of second solar cells;

a step of bonding the plurality of second solar cells to the buffer layer to form a first unit tandem solar cell where the first perovskite unit solar cell, the buffer layer, and the second solar cell are sequentially stacked and a second unit tandem solar cell where the second perovskite unit solar cell, the buffer layer, and the second solar cell are sequentially stacked; and a step of electrically connecting the first unit tandem solar cell to the second unit tandem solar cell using a connection line, wherein the connection line extends from a top surface of the second solar cell of the second unit tandem solar cell to the top surface of the first conductive charge transporting layer exposed at the contact part of the first perovskite unit solar cell through side surfaces of the buffer layer and the second solar cell of the second unit tandem solar cell, the second portion of the top surface of the second perovskite unit solar cell, and a side surface of the second perovskite unit solar cell, and wherein the buffer layer and the plurality of second solar cell do not overlap the contact part.

2. The method of claim 1, wherein the step of preparing the perovskite solar cell comprises a step of sequentially forming the first conductive charge transporting layer, the light absorption layer, and the second conductive charge transporting layer on the substrate.

3. The method of claim 1, wherein the step of forming the partition part comprises a process of removing a certain region of each of the first conductive charge transporting layer, the light absorption layer, and the second conductive charge transporting layer to expose a top surface of the substrate.

4. The method of claim 1, wherein the step of forming the buffer layer comprises a process of forming a film, including a plurality of holes, in the top surface of each of the first perovskite unit solar cell and the second perovskite unit solar cell and a process of filling a conductive layer into the plurality of holes included in the film.

5. The method of claim 4, wherein the process of forming the film including the plurality of holes comprises a process of forming the film in a semi-dried state, and the step of forming the first unit tandem solar cell and the second unit tandem solar cell comprises a process of placing the second solar cell on the buffer layer and then curing the film in the semi-dried state.

6. The method of claim 4, wherein the plurality of holes included in the film comprises a plurality of first holes passing through the film and extending in a first direction and a plurality of second holes passing through the film and extending in a second direction intersecting with the first direction, and the conductive layer contacts a top surface of each of the first and second perovskite unit solar cells and a bottom surface of the second solar cell.

7. The method of claim 4, wherein the film does not overlap the contact part, and the contact part is not covered by the film and is exposed.

8. The method of claim 1, wherein the step of electrically connecting the first unit tandem solar cell to the second unit tandem solar cell electrically connects an electrode pattern, included in a top surface of the second solar cell of the second unit tandem solar cell, to the first conductive charge transporting layer of the first perovskite unit solar cell exposed at a contact part of the first unit tandem solar cell by using the connection line.

9. The method of claim 8, wherein the one connection line extends along a side surface of the second solar cell of the second unit tandem solar cell and a side surface of the buffer layer under the second solar cell, extends along a top surface and a side surface of the second conductive charge transporting layer and a side surface of a light absorption layer of the first perovskite unit solar cell provided at one side of the contact part across the partition part, and extends up to a top surface of the first conductive charge transporting layer of the first perovskite unit solar cell exposed at the contact part.

10. The method of claim 4, wherein the step of preparing the plurality of second solar cells comprises a process of forming an electrode pattern having a same pattern as a pattern of the conductive layer, and the step of bonding the plurality of second solar cells comprises a process of allowing the conductive layer to overlap the electrode pattern.

* * * * *